United States Patent
Vogler et al.

(10) Patent No.: US 8,493,101 B2
(45) Date of Patent: Jul. 23, 2013

(54) DRIVE CIRCUIT WITH A TRANSMISSION CIRCUIT FOR CAPACITIVELY TRANSMITTING A SIGNAL AND ASSOCIATED METHOD

(75) Inventors: Bastian Vogler, Fuerth (DE); Reinhard Herzer, Ilmenau (DE); Matthias Rossberg, Ilmenau (DE)

(73) Assignee: Semikron Elektronic GmbH & Co., KG, Nürnberg (DE)

( * ) Notice: Subject to any disclaimer, the term of this patent is extended or adjusted under 35 U.S.C. 154(b) by 105 days.

(21) Appl. No.: 13/100,096

(22) Filed: May 3, 2011

(65) Prior Publication Data

US 2011/0304389 A1    Dec. 15, 2011

(30) Foreign Application Priority Data

May 3, 2010    (DE) .......................... 10 2010 018 997

(51) Int. Cl.
*H03B 1/00*    (2006.01)
*H03K 3/00*    (2006.01)

(52) U.S. Cl.
USPC ......................................... 327/108; 327/112

(58) Field of Classification Search
USPC ......... 327/333, 108, 110, 112; 307/1; 326/63, 326/68
See application file for complete search history.

(56) References Cited

U.S. PATENT DOCUMENTS 7,656,201 B2 *   2/2010   Kanzaki ........................ 327/108
7,701,278 B2     4/2010   Herzer et al.

FOREIGN PATENT DOCUMENTS

| DE | 101 52 930      | 10/2002 |
| DE | 10 2006 037 336 | 2/2008  |
| DE | 10 2006 050 913 | 5/2008  |
| DE | 10 2007 006 319 | 8/2008  |

* cited by examiner

*Primary Examiner* — Lincoln Donovan
*Assistant Examiner* — Diana J Cheng
(74) *Attorney, Agent, or Firm* — The Law Offices of Roger S. Thompson

(57) ABSTRACT

A drive circuit with a circuit for transmitting a signal from a primary side having a first ground to a secondary side having a second ground. The transformer has capacitive coupling between the primary and secondary sides. The transformer has an ON transmission branch and an OFF transmission branch, which each have a first partial branch and a second partial branch. Capacitive coupling between the primary and secondary sides is effected in each partial branch by high-voltage capacitors. In the inventive method, in each transmission branch, the signal generates a current flow through a first HV capacitor of a first partial branch and an inverse current flow through a second HV capacitor of a second partial branch. This respective current flow is detected on the secondary side and is supplied to an evaluation circuit common to the two partial branches and reconstructs the primary-side input signal on the secondary side.

8 Claims, 4 Drawing Sheets

DRIVE CIRCUIT WITH A TRANSMISSION CIRCUIT FOR CAPACITIVELY TRANSMITTING A SIGNAL AND ASSOCIATED METHOD

BACKGROUND OF THE INVENTION

1. Field of the Invention

The invention is directed to a monolithically integratable drive circuit with transmission circuits and an associated method for operating such a drive circuit to transmit an input signal such as from a drive logic unit to a driver.

2. Description of the Related Art

Drive circuits such as described herein are needed in power electronic systems to drive power semiconductor switches which are arranged as individual switches or in a bridge circuit. Such bridge circuits are known as single-phase, two-phase or three-phase bridge circuits in the form of power semiconductor modules. The single-phase so-called half-bridge constitutes the basic module of a multiplicity of power electronic circuits. In a half-bridge circuit, two power switches, a first so-called TOP switch and a second so-called BOT switch, are arranged in series.

Such a half-bridge generally has a connection to a DC intermediate circuit. The output, typically the AC voltage connection of the half-bridge, is usually connected to a load. The drive circuit generally consists of a plurality of partial circuits or function blocks. The control signal from a super-ordinate control logic unit, for example a microcontroller, is conditioned in a first partial circuit, the drive logic unit, and is supplied, via further components, to the driver circuits and finally to the control input of the respective power switch.

In the case of relatively high intermediate circuit voltages, generally greater than 40 V, the drive logic unit is usually isolated in terms of potential from the driver circuits, since the associated power switches are at a different potential and voltage isolation is therefore unavoidable. This isolation applies at least to the TOP switch, but is also embodied at higher powers for the BOT switch on account of possible chopping of the ground potential during switching. Such isolation can be realized, on the one hand, by DC isolation, for example by pulse transformers, optocouplers or optical waveguides, or, on the other hand, by integrated circuit technology, for example in an HVIC (High Voltage Integrated Circuit). The latter variant is being used with increasing frequency because it offers various advantages, such as small dimensions, low price and a long lifetime. In this respect, HVICs make it possible to integrate a high-voltage component with a breakdown voltage greater than or equal to the intermediate circuit voltage which can be used in circuits for signal level conversion, in so-called level shifters. A lateral high-voltage MOSFET is usually used for the latter.

Such a transmission circuit is part of the drive circuit and is preferably in the form of an integrated circuit arrangement. It serves for transmitting a signal from a circuit on the primary side having a defined reference potential to a circuit on the secondary side having an occasionally higher or lower reference potential. Bidirectional or unidirectional transmission circuits are known here.

Two basic isolation technologies are known for forming HVICs: firstly the SOI (Silicon On Insulator) technologies and secondly pn-isolated technologies (junction isolation). The SOI technology affords dielectric isolation of components and component groups, but is currently available only up to a dielectric strength of about 800 V. The SOI substrate wafers are significantly more expensive than standard substrates, although the costs are offset by a series of technical advantages and also considerable process simplifications which result from the dielectric isolation. In the case of pn-isolated technologies, the reverse voltage is taken up by a reverse-biased pn junction. This technology is currently available up to about 1200 V. However, production thereof is very complicated and therefore cost-intensive. Furthermore, there are technical problems, for example with leakage currents and latch-up effects, inter alia, at relatively high temperatures, for example at an operating temperature of more than about 125° C., and also in the event of chopping of the ground potential during fast dynamic operations.

In integrated drive circuits, the practice of transmitting the drive signals from the drive logic unit to the TOP secondary side associated with the TOP switch via level shifter circuits is known in principle according to the prior art. Driving with potential isolation is necessary, since the TOP secondary side, in contrast to the BOT secondary side associated with the BOT switch, is at an elevated reference potential in phases. According to the prior art of HVICs, signals are transmitted from the drive side to the TOP secondary side by pulsed (dynamic) differential transmission, switch-on and switch-off pulses being generated on the drive side from the signal to be transmitted and being transmitted to the TOP secondary side via a level shifter. This type of transmission is distinguished by a high degree of transmission reliability and a low power demand.

The most significant disadvantage of the method is the required generation of the switch-on and switch-off pulses. This results in increased circuit complexity and space requirement and thus higher costs. In principle, various integrated level shifter topologies are known. The simplest topology comprises an HV (high voltage) transistor having a corresponding blocking capability and a resistor in series. If a signal is passed to the gate of the HV transistor, the latter switches on. The shunt current thereby generated through the level shifter causes a voltage drop across the resistor, which can be detected as a signal by an evaluation circuit. By virtue of their principle, such level shifters with HV transistors contain a shunt current path, which is required for signal transmission, between the drive logic unit and the driver, and so no DC isolation is achieved.

DE 101 52 930 A1 discloses an improved level shifter topology in which the drive signal is transmitted progressively, by a plurality of identical level shifters connected in cascade, via intermediate potentials. It is thus possible to use transistors which have only a fraction of the required blocking capability of the entire level shifter. The blocking capability of the level shifter can thus be increased significantly.

DE 10 2006 037 336 discloses a level shifter in the form of a series circuit comprising n-channel HV transistors. This topology has the advantages that firstly the power consumption and secondly the circuit complexity are reduced by comparison with DE 101 52 930 A1. This results in a smaller space requirement and therefore also lower costs.

The common feature of all of these topologies for HVICs is that, in the case of complementary construction of the level shifter, it is also possible, in principle, to transmit signals from a circuit part having a high reference potential to a circuit part having a low reference potential. This property can be used to transmit signals back from the TOP secondary side to the drive logic unit. However, the prerequisite for this is a p-channel HV transistor.

Internal inductances of a system comprising a power semiconductor module and a drive circuit, for example line inductances, may result in severe chopping of the reference potential of the BOT secondary side in a positive or negative direction during switching of the power switches. Severe chopping of the reference potential of the TOP secondary side below the reference potential on the drive side may likewise result. This occurs to a particularly great extent in medium-power and high-power systems in which large currents, for example greater than 50 A, are switched. In this case, the potential difference can assume values that exceed the reverse voltage of the transistors used in the drive circuit, for example greater than about 20 V.

The known pn isolation technologies have the disadvantage that the triggering of parasitic thyristor structures, so-called latch-up, can occur in the event of corresponding chopping of the reference potential in the negative direction. This leads to loss of function and possibly to destruction of the affected transistors.

This limitation is not manifested in SOI technologies, due to the dielectric isolation of the components, with the result that it is possible to implement, using circuit technology, a level shifter which ensures reliable signal transmission even in the case of a secondary-side reference potential which is briefly or permanently negative. DE 10 2006 050 913 A1 discloses such a level shifter for the BOT secondary side embodied, using SOI technology, as an UP and a DOWN level shifter branch, while DE 10 2007 006 319 A1 discloses such a level shifter for the TOP secondary side embodied, likewise using SOI technology, as an UP and a DOWN level shifter branch.

SUMMARY OF THE INVENTION

It is therefore an object of the invention to present an at least partially monolithically integratable drive circuit, and associated method, in which positive and negative potential differences can be overcome in an identical manner and at the same level and there is no need for a pulse generation circuit on the primary side.

The invention includes a drive circuit with a transmission circuit (referred to as a transformer below) for preferably unidirectionally transmitting a signal from a first circuit part having a first reference potential, the primary side, to a second circuit part having a second potential, the secondary side, for example the TOP secondary side. Such a transformer is referred to as an UP transformer below, whereas a DOWN transformer transmits a signal from a secondary side to the primary side. The transformer itself is in the form of an arrangement of two identical, independently operating, transmission branches and a downstream signal evaluation circuit which is common to the two transmission branches. In this case, the signal to be transmitted is applied directly to a first transmission branch, the ON transmission branch, for example for switching on a power switch, and is applied in inverted form to the second transmission branch, the OFF transmission branch, for example for switching off the power switch.

In the case of a positive input signal edge of the signal to be transmitted, the ON transmission branch generates a switch-on signal of a particular length at its secondary-side output. In the case of a negative input signal edge of the signal to be transmitted, the OFF transmission branch generates a switch-off signal of a particular length at its secondary-side output. The secondary-side signal evaluation circuit detects the signals at these outputs and reconstructs the signal to be transmitted.

In the respective transmission branch, the transmission from the primary side to the secondary side is effected using two capacitors in a respective associated partial branch which have the necessary dielectric strength for the potential difference. In the inventive transmission method, one capacitor is charged, while a corresponding capacitor is discharged, by a primary-side circuit part in each of the partial branches. This charging or discharging operation is detected on the secondary side.

In the case of an UP transformer in the inventive drive circuit, a secondary-side output signal is generated from a signal at the input of the respective transmission branches in an edge-triggered manner without the need for a separate pulse generation circuit on the primary side, as is the case with transformers based on HV transistors.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The inventive solution is explained in more detail using FIGS. 1 to 6.

DETAILED DESCRIPTION OF THE PRESENTLY PREFERRED EMBODIMENTS

Figure 1:
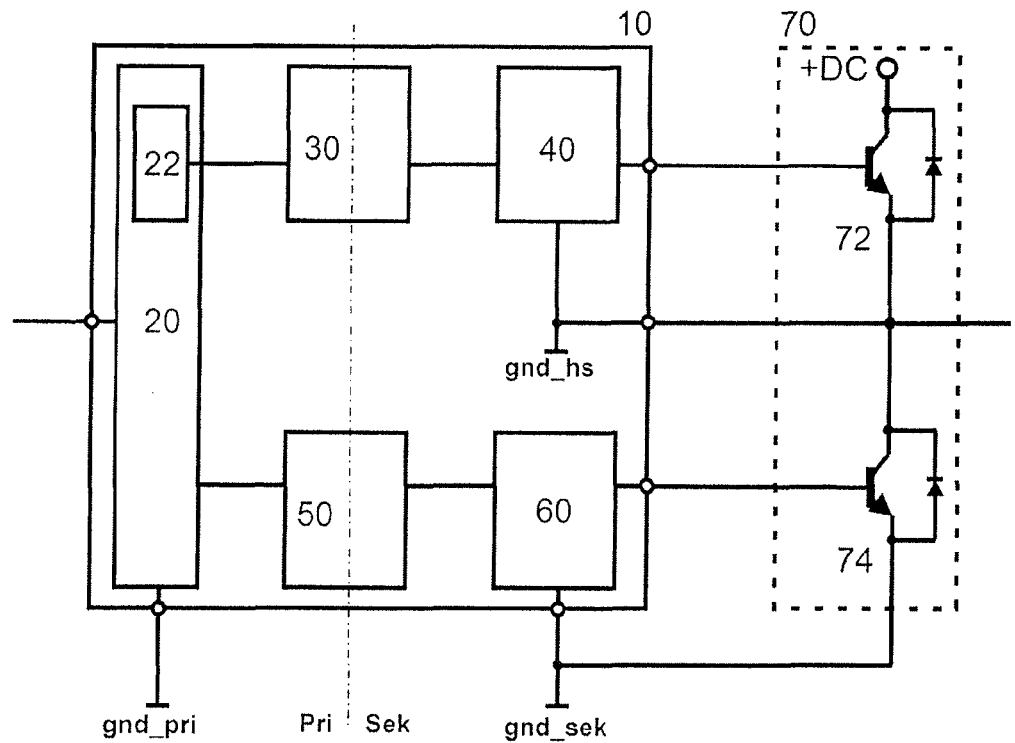
FIG. 1 is a block diagram having a monolithically integrated drive circuit according to the prior art.

To explain the invention, FIG. 1 shows a block diagram having a monolithically integrated drive circuit 10 according to the prior art as well as a half-bridge circuit 70 which can be driven thereby. Half-bridge circuit 70 has a TOP power switch 72 and a BOT power switch 74 which in this case are each in the form of an IGBT with a diode reverse-connected in parallel. The BOT power switch 74 is at the reference potential (gnd_sek) of the secondary side, which, in applications having small line inductances, is virtually equal to the reference potential (gnd_pri) of the primary side of the drive circuit 10.

Drive circuit 10 itself has a drive logic unit 20 with a necessary pulse generation circuit 22, a first UP transformer 30 with a downstream TOP secondary side 40, and a second UP transformer 50 with a downstream BOT secondary side 60, in which case the respective UP transformers are in the form of level shifters according to the prior art.

Figure 2:
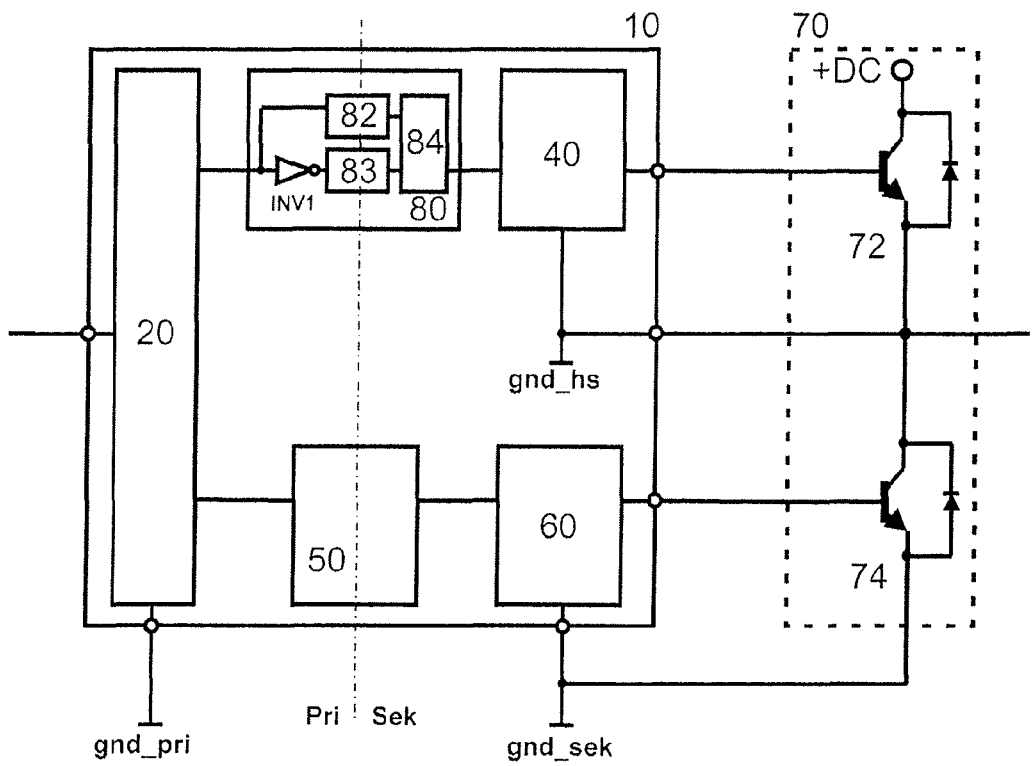
FIG. 2 is a block diagram having relevant parts of a first monolithically integrated drive circuit according to the invention with an UP transformer.

FIG. 2 shows a block diagram having relevant parts of a monolithically integrated drive circuit according to the invention with an UP transformer 80 which has an ON transmission branch 82, a fundamentally identical OFF transmission branch 83 and a downstream signal evaluation circuit 84 which is common to these transmission branches. The signal to be transmitted is applied directly to the ON transmission branch 82 and is applied to the OFF transmission branch 83 by means of an upstream first inverter (INV1). The UP transformer thus transmits the signal from the primary side (Pri)

having a first potential to the secondary side (Sek) having a second potential within the drive circuit.

Figure 3:
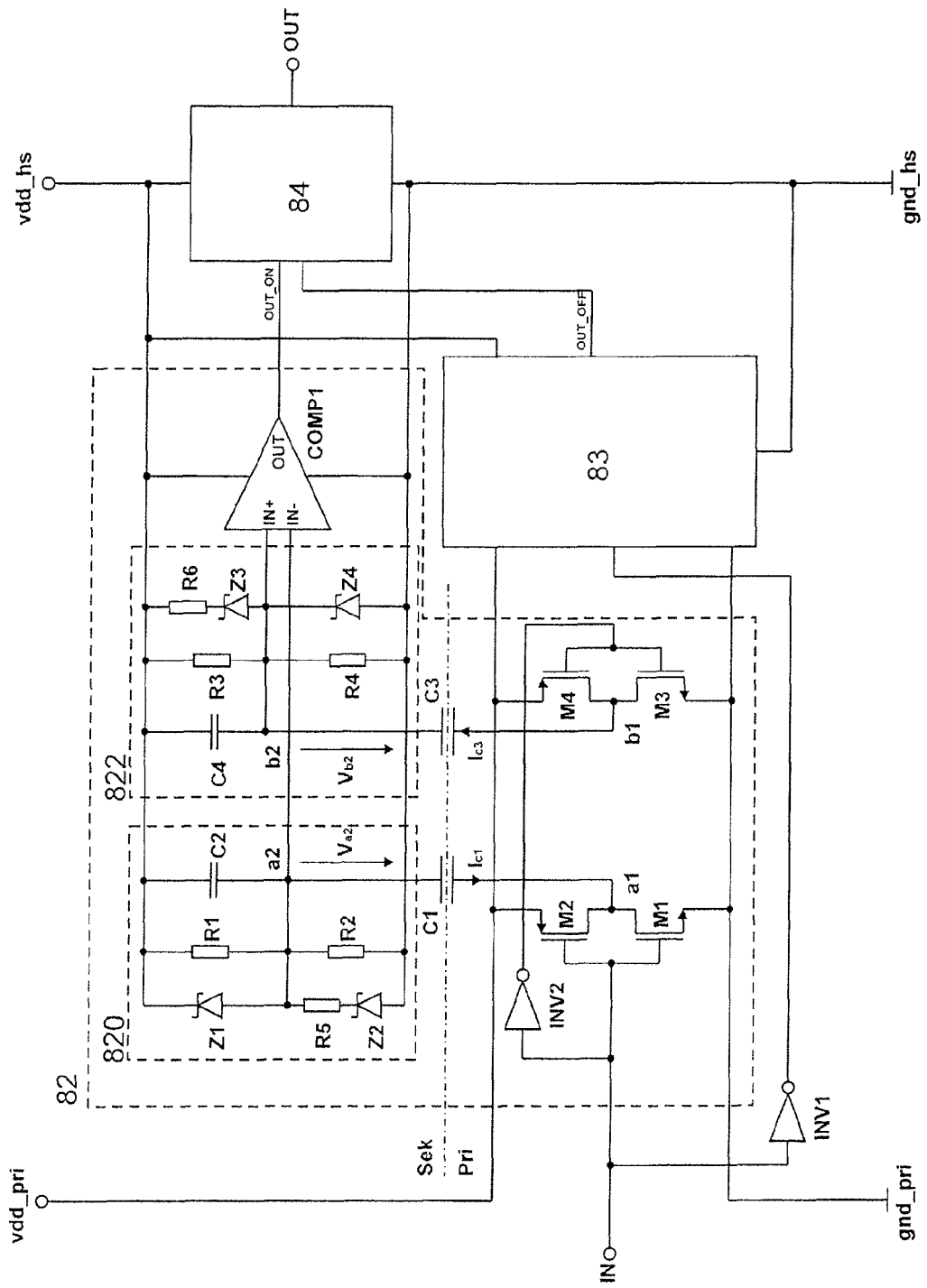
FIG. 3 shows a basic circuit of an UP transformer.

FIG. 3 shows a basic circuit of an UP transformer 80 consisting of a first inverter (INV1), an ON transmission branch 82 and an identical OFF transmission branch 83 as well as a signal evaluation circuit 84. Since the two transmission branches are constructed in an identical manner, only the ON transmission branch is illustrated in detail, in which case the following general statements apply to both transmission branches.

The respective transmission branch consists of a primary-side circuit part, a secondary-side circuit part and two HV capacitors (C1, C3) which connect the two circuit parts. The primary-side circuit part has two bridge circuits (M1, M2 and M3, M4) each with one transistor (M1, M3) of the n-channel type and one transistor (M2, M4) of the p-channel type. The source connections of the n-channel transistors (M1, M3) are connected to the primary-side reference potential (gnd_pri) and the source connections of the p-channel transistors (M2, M4) are connected to the primary-side supply voltage (vdd_pri). The gate connections of the transistors in the first bridge circuit (M1, M2) are directly connected to the input (IN) of the UP transformer 80. The gate connections of the transistors in the second bridge circuit (M3, M4) are connected to the output of a second inverter (INV2) whose input is connected to the input (IN) of the UP transformer 80. The first HV capacitor (C1) is connected, on the one hand, to the output (a1) of the first bridge circuit (M1, M2) and, on the other hand, to a first secondary-side node (a2). The first bridge circuit (M1, M2), the first HV capacitor (C1) and the first secondary-side node (a2) form, with the connection of the latter, the first partial branch. The second partial branch is fundamentally of identical construction and differs from the first partial branch only in the connection of the second secondary-side node (b2).

The connection of the secondary-side nodes (a2, b2) is as follows and is connected to a first comparator (COMP1). The first connection of further capacitors (C2, C4) is connected to an associated node (a2, b2), whereas the second connection is connected to the supply voltage of the secondary side (vdd_hs). The secondary-side node (a2) is connected to the inverting input (IN−) of the first comparator (COMP1). The secondary-side node (b2) is connected to the non-inverting input (IN+) of the first comparator (COMP1). The resistors (R1, R2 and R3, R4) respectively form a voltage divider between the supply voltage of the secondary side (vdd_hs) and the reference (ground) potential of the secondary side (gnd_hs), the center point of which divider is connected to the associated node (a2, b2). A series circuit comprising two zener diodes (Z1, Z2 and Z3, Z4) and a resistor (R5 and R6) is connected in parallel with the voltage dividers and the centre point of this respective circuit is in turn connected to the node. The output (OUT_ON) of the first comparator (COMP1) is simultaneously the output of the corresponding ON transmission branch 82 and is connected to the associated input of the signal evaluation circuit 84.

The ratio of the capacitances of the HV capacitors (C1, C3) to those of the associated further capacitors (C2, C4) of the secondary-side connection of the respective nodes (a2, b2) is advantageously selected such that the capacitances thereof have the approximate ratios of C1/C2=C3/C4<<1. According to the invention, the breakdown voltage of the HV capacitors (C1, C3) is greater than the maximum potential difference occurring between the secondary-side supply voltage (vdd_hs) and the primary-side reference potential (gnd_pri). As long as no voltage transients occur during the transmission method according to the invention at the secondary-side nodes (a2, b2), that is to say between primary-side and secondary-side reference potentials and supply voltages, the transmission branch is in the steady state. The potentials at the secondary-side nodes (a2, b2), based on the secondary-side reference potential (gnd_hs), are then determined by the voltage dividers (R1, R2 and R3, R4) and by the level of the secondary-side supply voltage (vdd_hs). The voltage dividers are designed such that the potential at the first secondary-side node (a2) is slightly higher, for example 100 mV, than the potential at the second secondary-side node (b2) in steady-state equilibrium. This ensures that the first comparator (COMP1) is driven in steady-state equilibrium in such a manner that its output (OUT_ON) remains in a LOW state.

The voltage dividers (R1, R2 and R3, R4) are also configured such that the potentials at the secondary-side nodes (a2, b2) correspond to approximately half the secondary-side supply voltage (vdd_hs). The further components (Z1, R5, Z2 and Z3, Z4, R6) in the connection of the secondary-side nodes (a2, b2) respectively limit possible chopping of the potentials to an upper value and a lower value if voltage transients occur at these nodes (a2, b2). In this case, the zener voltage of the zener diodes (Z1-Z4) is respectively selected in such a manner that the potentials at the secondary-side nodes (a2, b2) can only assume values within a particular voltage window.

The signal transmission according to the invention occurs by charge transfer at the HV capacitors (C1, C3) via a transmission branch irrespective of whether the reference (ground) potential (gnd_hs) of the secondary side is statically higher than, the same as or lower than the reference potential (gnd_pri) of the primary side.

Figure 4:
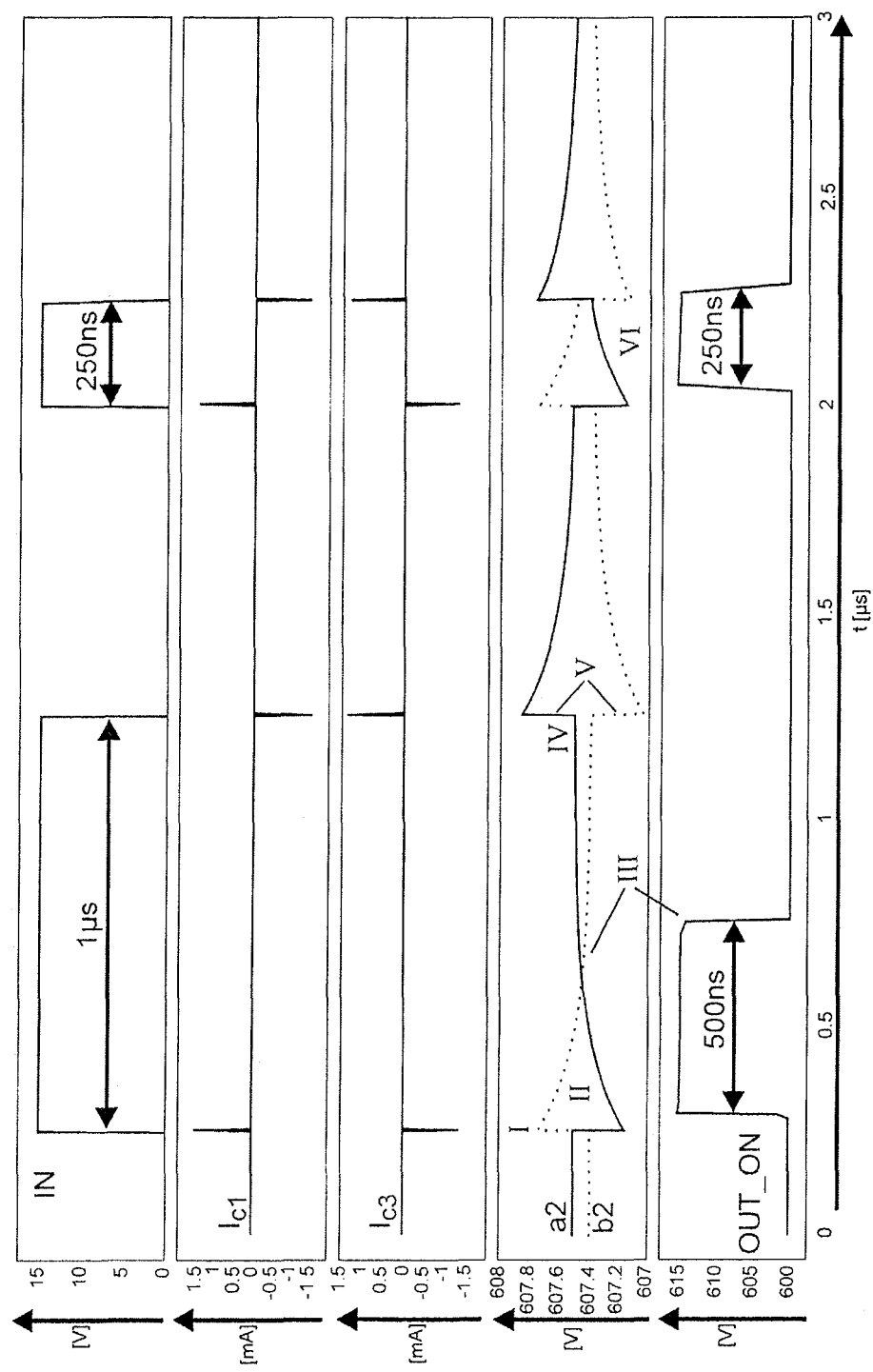
FIG. 4 shows simulation results of the inventive method.

According to the inventive method, an input signal applied to the input (IN) of the UP transformer 82 is applied directly to the input of the ON transmission branch 82 and is applied in inverted form to the input of the OFF transmission branch 83. Due to the identical design of the ON and OFF transmission branches 82, 83, only the function of the ON transmission branch is described in detail below. As an explanation for this, FIG. 4 shows associated simulation results in the case of a positive reference potential of the TOP secondary side (gnd_hs=600 V). In this case, the reference potential of the primary side (gnd_pri) is at ground potential (0 V), for example. Square-wave signals were selected as the signal waveform. The signal at the input (IN), the potential profiles at the nodes (a2, b2) and the signal at the output (OUT_ON) of the ON transmission branch are each illustrated. The statements made apply to the OFF transmission branch in the same way but with interchanged positive and negative input signal edges.

In the case of a positive signal edge at the input (IN), the first n-channel transistor (M1) is switched on and the first p-channel transistor (M2) is switched off. The potential at the first primary-side node (a1) accordingly falls, in a transient manner, from a voltage close to the primary-side supply voltage (vdd_pri) to a voltage close to ground potential (gnd_pri). During this voltage change, a current $I_{C1}$ corresponding to the general formula $I_C = C \cdot dU_C/dt$ flows, via the first HV capacitor (C1), from the secondary side to the primary side and pulls down the potential at the secondary-side node (a2) according to the capacitive voltage divider rule, for example by 300 mV (section I). At the same time, the second inverter (INV2) applies a negative signal edge to the second bridge circuit (M3, M4), as a result of which the second n-channel transistor (M3) is switched off and the second p-channel transistor (M4) is switched on. As a result, the potential at the second primary-side node (b1) rises, in a transient manner, from a voltage close to ground potential (gnd_pri) to a voltage close to the primary-side supply potential (vdd_pri). During the voltage change, a current $I_{C3}$ flows, via the second HV capacitor (C3), from the primary side to the secondary side and pulls up the potential at the secondary-side node (b2), for example by 300 mV (section I). As a result of this potential chopping with the opposite sign, the potential at the secondary-side node (a2) is now less than that at the secondary-side node (b2), as a result of which the output of the UP transformer (OUT_ON) assumes the value HIGH. After the end of the voltage transients, the potentials at the secondary-side nodes approach their static value exponentially with the time constant according to the resistive-capacitive node impedance (section II). The time constant $T_{a2}$ and $T_{b2}$ combines all resistive and capacitive components which are involved in reversing the charge of the corresponding nodes a2 and b2. As long as no switch-off edge appears at the input (IN), the discharging process proceeds independently until the static basic state (section IV). As soon as the discharging operation has subsided to such an extent that the first secondary-side node (a2) is at a higher potential than the second secondary-side node (b2), for example after 500 ns, the output of the transmission branch (OUT_ON) switches to LOW again (section III).

The negative edge of the signal at the input (IN) does not give rise to an output signal of the ON transmission branch 82 (section V), but rather generates a corresponding signal (not illustrated) in the OFF transmission branch 83. If steady-state equilibrium has not yet been reached, a negative signal edge leads directly to a LOW level at the output (OUT_ON) of the first comparator (COMP1) (section VI). A positive edge of the signal at the input (IN) likewise always leads to a HIGH level at the output (OUT_ON) of the ON transmission branch 82 irrespective of whether steady-state equilibrium has already been reached at the secondary-side nodes (a2, b2). Each edge at the input (IN) therefore always leads to a correlating switching state at the output (OUT_ON) if that state is not already present. This means that high-frequency pulse sequences can also be transmitted.

Further simulations show that signal transmission by charge transfer at the HV capacitors is effected irrespective of whether the reference potential (gnd_hs) of the secondary side is statically higher than, the same as or lower than the reference potential (gnd_pri) of the primary side. During a switching operation of the power switches, in which the BOT switch is switched off or on and the TOP switch is switched on or off at the same time or in quick succession, the voltage at the output of the half-bridge rises or falls with a rapid change per unit time (voltage transients) of, for example, 10 kV/μs. The reference potential (gnd_hs) of the secondary side simultaneously rises to the same extent. During these phases, signal transmission via the transmission branches 82, 83 and thus via the entire UP transformer 80 is not possible and is even undesirable.

The transmission of a signal from the primary side to the secondary side via an UP transformer according to the invention can be summarized as follows. In the case of a positive input signal edge, a positive pulse of a particular length is generated at the output (OUT_ON) of the ON transmission branch 82 and is detected by the signal evaluation circuit 84. The output (OUT) of the UP transformer 80 is then set to a switch-on status, for example HIGH, which is also present at the output (OUT_ON) after the end of the signal. The output (OUT_OFF) of the OFF transmission branch 83 remains at LOW. In the case of a negative input signal edge, a positive pulse of a particular length is generated at the output (OUT_OFF) of the OFF transmission branch 83 and is likewise detected by the signal evaluation circuit 84. The output (OUT) of the UP transformer 82 is then reset. The output (OUT_ON) of the ON transmission branch 82 remains at LOW. The full length of the signal at the input (IN) is transmitted and transferred to the TOP secondary side 40. No signals are transmitted during high voltage transients between the primary-side reference potential (gnd_pri) and the secondary-side reference potential (gnd_hs). The outputs of the transmission branches (OUT_ON, OUT_OFF) remain in the LOW state or are reset to the LOW state. The stored state at the output (OUT) of the UP transformer 80 is retained.

Figure 5:
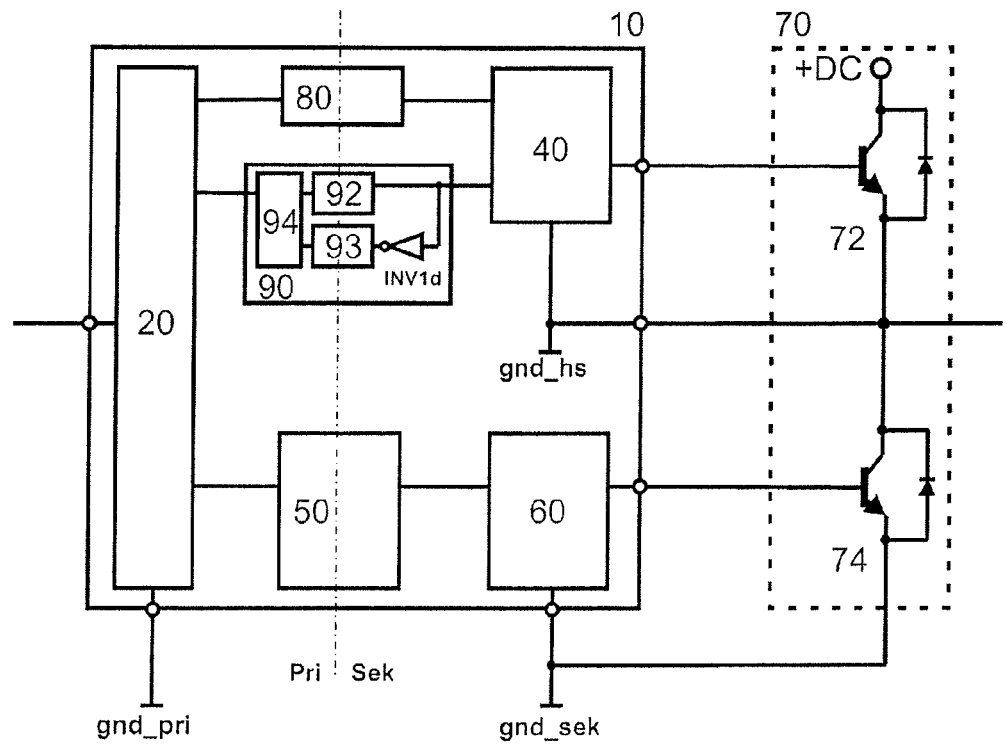
FIG. 5 is a block diagram having relevant parts of a second monolithically integrated drive circuit according to the invention with an UP transformer and a DOWN transformer.

FIG. 5 shows a block diagram having relevant parts of a second monolithically integrated drive circuit according to the invention with an UP transformer and a DOWN transformer, the DOWN transformer being constructed in a complementary manner to the UP transformer. The DOWN transformer is used, for example, to transmit sensor or status signals from the secondary side to the primary side.

Figure 6:
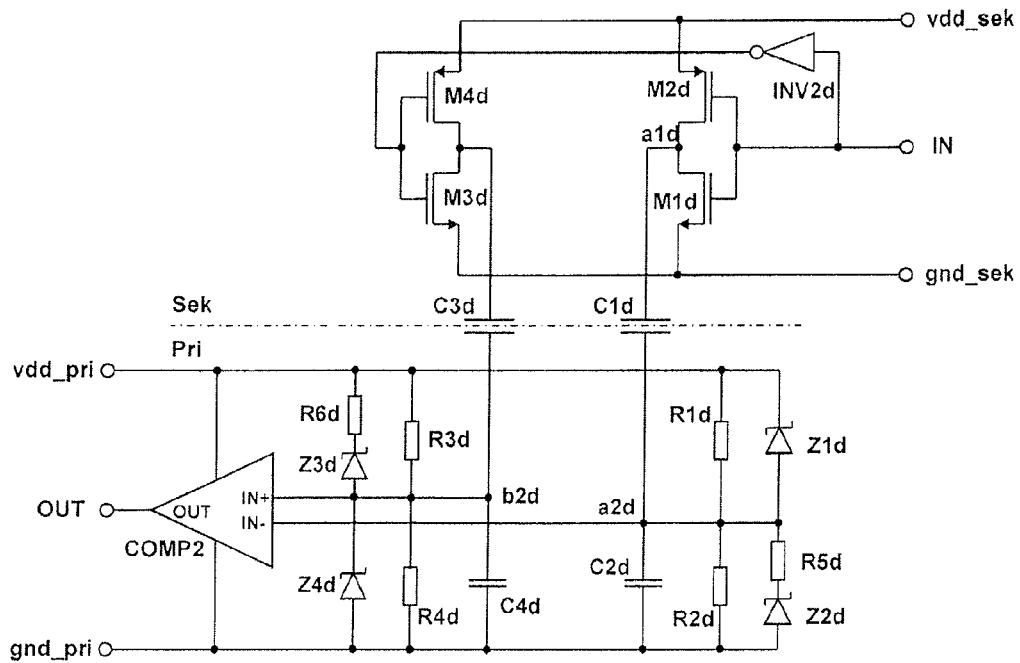
FIG. 6 shows a basic circuit of a DOWN transformer.

In this respect, FIG. 6 shows a basic circuit of a DOWN transformer 90 as part of a monolithically integrated drive circuit according to the invention. In a similar manner to the UP transformer 80 according to FIG. 3, the DOWN transformer 90 consists of an ON transmission branch 92 and an identical OFF transmission branch 93 and a signal evaluation circuit 94 connected downstream of said branches. The signal which is generated in the TOP secondary side 40 and is to be transmitted is applied directly to the ON transmission branch 92 and is applied to the OFF transmission branch 93 via a third inverter (INV3). The output of the signal evaluation circuit 94 is connected to the drive logic unit 20 of the primary side (Pri).

In order to evaluate a signal, which is generated on the TOP secondary side, on the primary side, there is usually no need to transmit the full length of this signal to the primary side. A short transmission pulse, for example when detecting an error, is often sufficient to correctly evaluate it in this case, and so it may be sufficient for the DOWN transformer to consist of only one transmission branch, the ON transmission branch.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A drive circuit with a transmission circuit for transmitting a signal from a primary side having a first ground to at least one secondary side, each at least one secondary side having a second ground, the drive circuit comprising:
   a transformer having capacitive coupling between the primary side and the at least one secondary side, said transformer having two branches, an ON transmission branch and an OFF transmission branch, each of said branches having a first partial branch and a second partial branch, each of said partial branches including a high voltage capacitor, each of said second partial branches including an inverter;

a secondary side ON transmission branch capacitor coupled in series with said high voltage capacitor in said first partial branch of said ON transmission branch;

a secondary side OFF transmission branch capacitor coupled in series with said high voltage capacitor in said first partial branch of said OFF transmission branch;

said ON transmission branch including means for receiving an input signal and applying the input signal to said first partial branch of said ON transmission branch and to said inverter within said second partial branch thereof; and said OFF transmission branch including an inverter for receiving the input signal and applying it to said inverter within said second partial branch thereof and also applying it, inverted, to said OFF transmission branch;

wherein said capacitive coupling between the primary and secondary sides is effected in each partial branch by means of said capacitors; and wherein each said partial branch has, on the primary side, a bridge circuit comprising an n-channel transistor and a p-channel transistor with a center point therebetween, said center point being connected to one of said high-voltage capacitors which is in turn connected, on the secondary side, to a respective associated node which is connected to a respective one of said secondary-side capacitors and a comparator, and has an associated partial connection to a respective voltage divider.

2. The drive circuit of claim 1, wherein the potential at said secondary-side nodes is slightly different in the steady state by means of a suitable configuration of said associated voltage dividers.

3. The drive circuit of claim 1, the capacitances of said secondary side capacitors is significantly higher than those of the associated HV capacitor.

4. The drive circuit of claim 1, wherein the external connections of the voltage dividers associated with the partial branches are connected to one of the secondary-side ground and the secondary-side supply voltage.

5. The drive circuit of claim 1, wherein the outputs of the two comparators of the transmission branches are connected to a signal evaluation circuit.

6. The drive circuit of claim 1, wherein the components are monolithically integrated in a high-voltage IC.

7. A method for operating the drive circuit of claim 1, comprising the steps of:

applying a primary-side input signal at the input of said transformer directly to said ON transmission branch and in inverted form to said OFF transmission branch;

generating, in each transmission branch, a signal for generating a current flow through said first HV capacitor of said first partial branch and an inverse current flow through said second HV capacitor of said second partial branch;

detecting said current flow on the secondary side; and supplying said current flow to an evaluation circuit which is common to said partial branches and reconstructs the primary-side input signal on the secondary side.

8. A method for operating a drive circuit with a transmission circuit for transmitting a signal from a primary side having a first ground to at least one secondary side, each at least one secondary side having a second ground, the drive circuit comprising:

a transformer having capacitive coupling between the primary side and the at least one secondary side, said transformer having two branches, an ON transmission branch and an OFF transmission branch, each of said branches having a first partial branch and a second partial branch, each of said partial branches including a high voltage capacitor, each of said second partial branches including an inverter;

a secondary side ON transmission branch capacitor coupled in series with said high voltage capacitor in said first partial branch of said ON transmission branch;

a secondary side OFF transmission branch capacitor coupled in series with said high voltage capacitor in said first partial branch of said OFF transmission branch;

said ON transmission branch including means for receiving an input signal and applying the input signal to said first partial branch of said ON transmission branch and to said inverter within said second partial branch thereof; and said OFF transmission branch including an inverter for receiving the input signal and applying it to said inverter within said second partial branch thereof and also applying it, inverted, to said OFF transmission branch;

wherein said capacitive coupling between the primary and secondary sides is effected in each partial branch by means of said capacitors;

wherein the method comprises the steps of applying a primary-side input signal at the input of said transformer directly to said ON transmission branch and in inverted form to said OFF transmission branch;

generating, in each transmission branch, a signal for generating a current flow through said first HV capacitor of said first partial branch and an inverse current flow through said second HV capacitor of said second partial branch;

detecting said current flow on the secondary side; and supplying said current flow to an evaluation circuit which is common to said partial branches and reconstructs the primary-side input signal on the secondary side;

wherein said secondary-side current flow is detected at two secondary-side nodes of the respective partial branches so that said nodes have a slightly different potential in the basic steady state, and their respective instantaneous potentials are compared in an associated comparator whose output forms the output of the transmission branch.

* * * * *